(12) United States Patent
Nishide et al.

(10) Patent No.: US 10,903,095 B2
(45) Date of Patent: Jan. 26, 2021

(54) HEAT TREATMENT APPARATUS OF LIGHT IRRADIATION TYPE

(71) Applicant: SCREEN HOLDINGS CO., LTD., Kyoto (JP)

(72) Inventors: Nobuhiko Nishide, Kyoto (JP); Takuya Kamimura, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 207 days.

(21) Appl. No.: 15/981,784

(22) Filed: May 16, 2018

(65) Prior Publication Data

US 2018/0337076 A1    Nov. 22, 2018

(30) Foreign Application Priority Data

May 17, 2017   (JP) ................................ 2017-097881

(51) Int. Cl.
  *H01L 21/67*   (2006.01)
  *H01L 21/687*  (2006.01)

(52) U.S. Cl.
  CPC .. *H01L 21/67115* (2013.01); *H01L 21/67017* (2013.01); *H01L 21/6719* (2013.01); *H01L 21/6875* (2013.01)

(58) Field of Classification Search
  None
  See application file for complete search history.

(56) References Cited

U.S. PATENT DOCUMENTS 5,326,725 A * 7/1994 Sherstinsky .......... C23C 16/042
                                                118/500
5,447,570 A * 9/1995 Schmitz ................. C23C 16/04
                                                118/715

(Continued)

FOREIGN PATENT DOCUMENTS

JP    2000-228370 A    8/2000
JP    2001-007038 A    1/2001

(Continued)

OTHER PUBLICATIONS

Taiwanese Office Action issued in corresponding Taiwanese Patent Application No. 107112229, dated Dec. 6, 2018, with English Translation of the Japanese Translation of the Taiwanese Office Action.

(Continued)

*Primary Examiner* — Thor S Campbell
(74) *Attorney, Agent, or Firm* — McDermott Will & Emery LLP

(57) ABSTRACT

Nitrogen gas supplied from the outside of a chamber flows into an annular first buffer to diffuse uniformly along the circumferential direction of a gas ring. The nitrogen gas filled in the first buffer flows into a second buffer with having a volume larger than that of the first buffer to diffuse more uniformly along the circumferential direction of the gas ring. The nitrogen gas filled in the second buffer flows into a labyrinth portion to flow through a bent flow path of the labyrinth portion from the inside toward the outside along the radial direction of the gas ring, so that a flow rate of the nitrogen gas decreases. The nitrogen gas flowing out of the labyrinth portion flows into a discharge flow path, and flows from the outside toward the inside along the radial direction of the gas ring to be discharged from the gas discharge opening.

2 Claims, 14 Drawing Sheets

(56) References Cited

U.S. PATENT DOCUMENTS

| | | | | |
|---|---|---|---|---|
| 5,516,367 | A | * | 5/1996 | Lei .................. C23C 16/4412 118/725 |
| 5,556,476 | A | * | 9/1996 | Lei .................. C23C 16/45519 118/728 |
| 5,888,304 | A | * | 3/1999 | Umotoy ........... C23C 16/45521 118/500 |
| 5,985,033 | A | * | 11/1999 | Yudovsky ......... H01L 21/68735 118/715 |
| 5,994,678 | A | * | 11/1999 | Zhao ................ C23C 16/4586 118/722 |
| 6,045,862 | A | * | 4/2000 | Mizukami ........... C23C 16/455 427/248.1 |
| 6,179,924 | B1 | | 1/2001 | Zhao .................... C23C 16/52 118/725 |
| 6,350,320 | B1 | * | 2/2002 | Sherstinsky ........ H01J 37/3244 118/500 |
| 6,521,292 | B1 | * | 2/2003 | Yudovsky ............ C23C 16/455 118/500 |
| 7,274,006 | B2 | * | 9/2007 | Okajima ........... H01L 21/67103 118/50.1 |
| 7,832,354 | B2 | * | 11/2010 | Katz .................. H01J 37/3244 118/723 R |
| 7,879,250 | B2 | * | 2/2011 | Katz .................. H01J 37/3244 156/345.48 |
| 7,972,441 | B2 | * | 7/2011 | Yokota ............... H01L 21/0214 118/715 |
| 8,097,120 | B2 | * | 1/2012 | Dhindsa ............ C23C 16/45521 118/715 |
| 9,099,513 | B2 | * | 8/2015 | Kogure ................ C23C 14/042 |
| 2003/0080104 | A1 | | 5/2003 | Kusuda |
| 2006/0207509 | A1 | * | 9/2006 | Tomita .............. H01L 21/67017 118/728 |
| 2010/0139556 | A1 | * | 6/2010 | Kagami ............ C23C 16/45519 118/58 |
| 2013/0260546 | A1 | | 10/2013 | Yamada et al. |
| 2014/0322897 | A1 | | 10/2014 | Samir et al. |
| 2016/0181142 | A1 | * | 6/2016 | Raj .................. H01L 21/67017 156/345.3 |
| 2017/0125265 | A1 | | 5/2017 | Samir et al. |
| 2018/0033652 | A1 | | 2/2018 | Samir et al. |

FOREIGN PATENT DOCUMENTS

| | | |
|---|---|---|
| JP | 2001-509645 A | 7/2001 |
| JP | 2009-260025 A | 11/2009 |
| JP | 2011-077143 A | 4/2011 |
| JP | 2012-074540 A | 4/2012 |
| JP | 2013-207033 A | 10/2013 |
| JP | 2016-526279 A | 9/2016 |
| JP | 2017-045982 A | 3/2017 |
| KR | 20-0416139 Y | 5/2006 |
| KR | 10-2013-0055061 A | 5/2013 |
| TW | 200706689 A | 2/2007 |
| TW | I297512 B | 6/2008 |
| TW | 201447032 A | 12/2014 |
| TW | 201448110 A | 12/2014 |

OTHER PUBLICATIONS

Taiwanese Office Action issued in corresponding Taiwanese Patent Application No. 107112229, dated May 2, 2019, with partial English Translation of the Japanese Translation of the Taiwanese Office Action.
Korean Office Action issued in corresponding Korean Patent Application No. 10-2018-0054934, dated Sep. 3, 2019, with English translation.
Taiwanese Office Action issued in corresponding Taiwanese Patent Application No. 107112229, dated Dec. 3, 2019, with English translation of the Japanese translation of the Taiwanese Office Action.
Japanese Notice of Reasons for Refusal issued in corresponding Japanese Patent Application No. 2017-097881, dated Nov. 24, 2020, with English translation.

* cited by examiner

F I G . 4
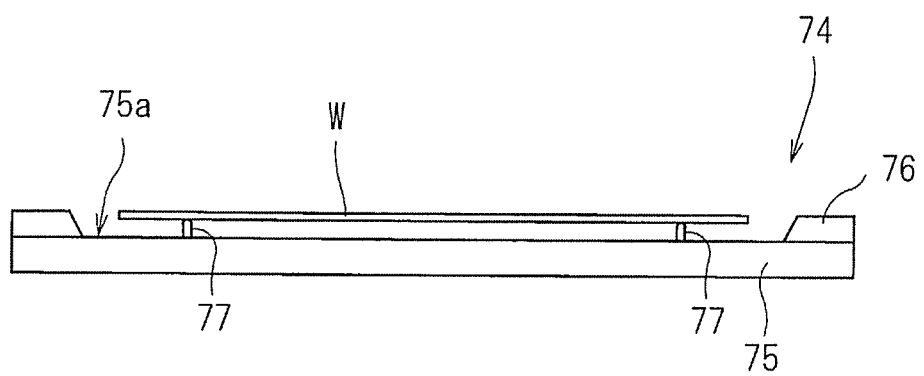

F I G. 5
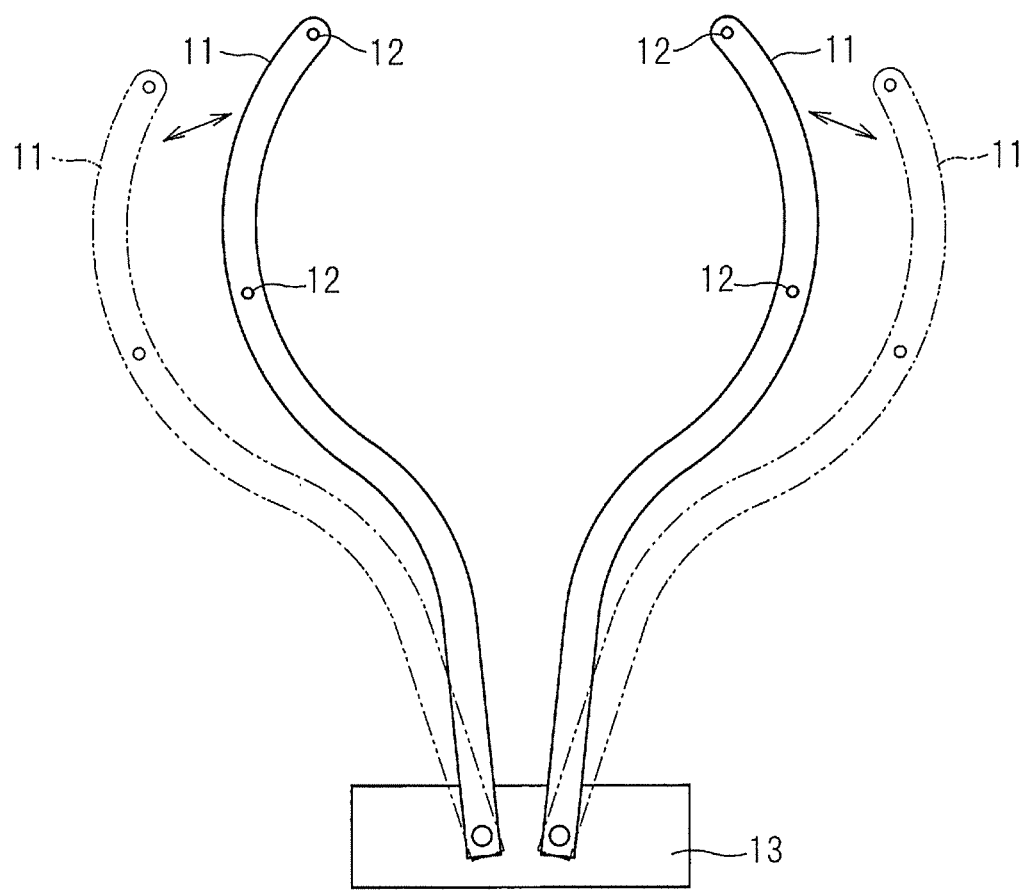

F I G . 6
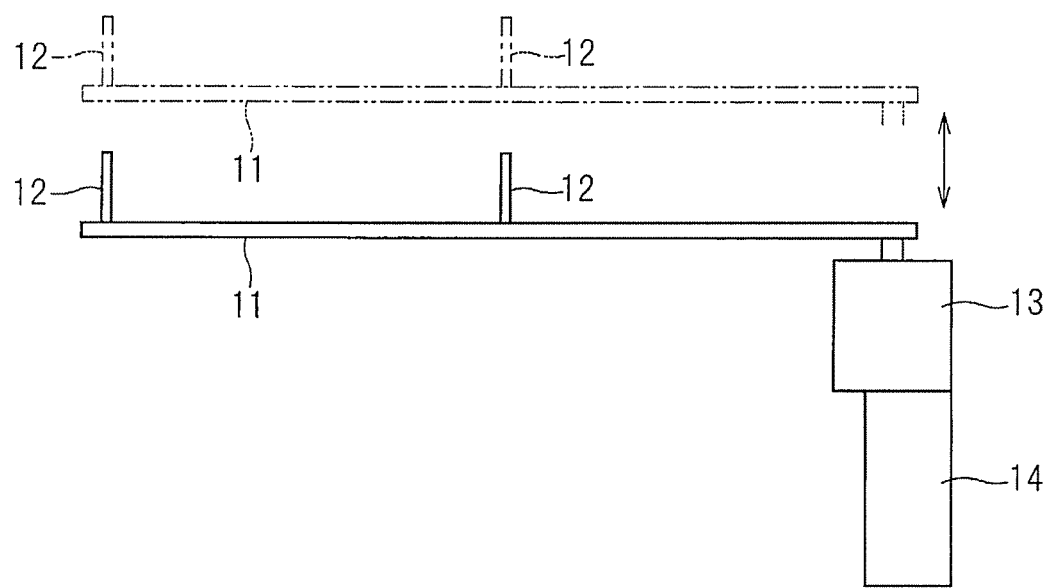

F I G. 7
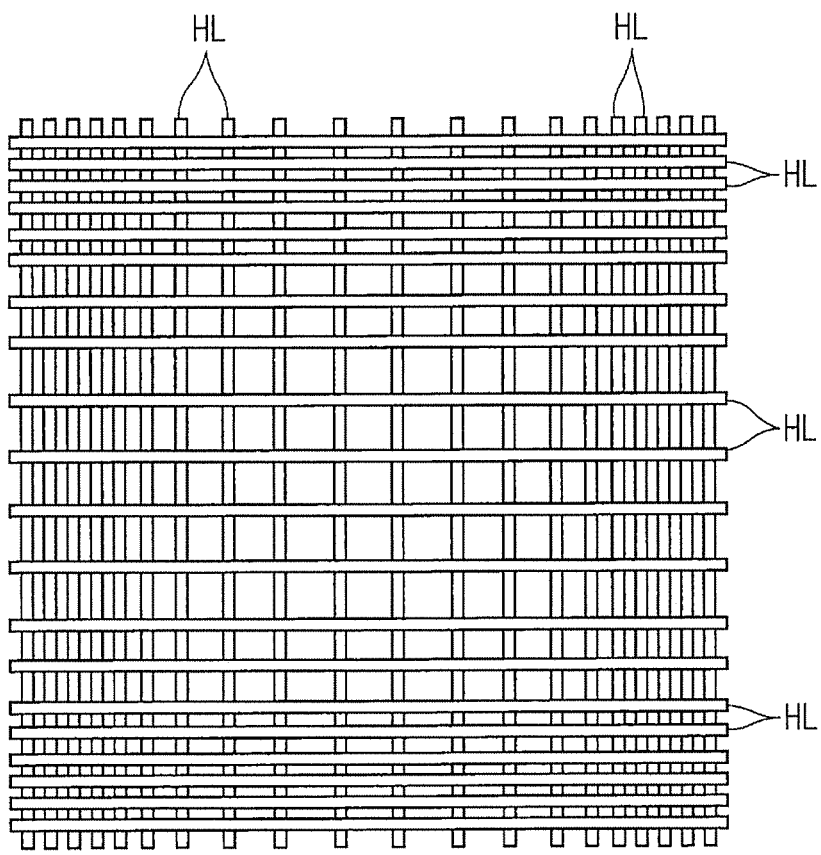

HEAT TREATMENT APPARATUS OF LIGHT IRRADIATION TYPE

BACKGROUND OF THE INVENTION

Field of the Invention

The present invention relates to a heat treatment apparatus for irradiating a thin-plated precision electronic substrate (hereinafter referred to as simply "substrate") such as a semiconductor wafer with light to heat the substrate.

Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer implanted with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

In a heat treatment apparatus using a xenon flash lamp, a surface of a semiconductor wafer is instantaneously irradiated with a flash of light having extremely high energy, so that temperature of the surface of the semiconductor wafer rapidly rises for a moment. As a result, the surface of the semiconductor wafer undergoes rapid thermal expansion and deforms to cause a phenomenon in which the semiconductor wafer vibrates or jumps on a susceptor at the time of flash light irradiation. Then, sliding between the semiconductor wafer and the susceptor, and turbulence, associated with vibration (or jumping) of the semiconductor wafer, generate particles in a chamber, and the particles adhere to the semiconductor wafer to contaminate the semiconductor wafer. For this reason, US 2013/0260546 proposes a technique of increasing a flow rate of nitrogen gas to be supplied into a chamber so as to efficiently discharge generated particles from the chamber to prevent the particles from adhering to a semiconductor wafer.

Unfortunately, while increasing the flow rate of the nitrogen gas to be supplied into the chamber is effective for reducing the number of particles, a gas flow in the chamber becomes nonuniform to cause a problem that uniformity of temperature distribution of the semiconductor wafer is deteriorated.

SUMMARY

The present invention is directed to a heat treatment apparatus for irradiating a substrate with light to heat the substrate.

In one aspect of the present invention, a heat treatment apparatus includes: a chamber having a side wall in a substantially cylindrical shape; a holder for holding a substrate in the chamber; a light irradiator for irradiating the substrate held by the holder with light; a quartz window provided so as to close an opening on one side of the side wall and to allow light emitted from the light irradiator to pass through into the chamber; and a gas ring in an annular shape attached to the side wall to guide treatment gas supplied from the outside of the chamber into the chamber, the gas ring including the following: a buffer section for diffusing the treatment gas supplied from the outside of the chamber, along a circumferential direction of the gas ring; and a resistive section for allowing the treatment gas filled in the buffer section to flow from the inside to the outside along a radial direction of the gas ring and giving resistance to a flow of the treatment gas to reduce flow velocity of the treatment gas along the radial direction, wherein a discharge flow path is formed between the gas ring and the quartz window to discharge the treatment gas flowing out of the resistive section into the chamber by allowing the treatment gas to flow from the outside toward the inside along the radial direction of the gas ring.

Even if a flow rate of the treatment gas supplied into the chamber is increased, flow velocity thereof can be reduced by evenly diffusing the treatment gas, thereby enabling the treatment gas to be uniformly supplied.

Preferably, the resistive section is provided with a projection that gives resistance to the flow of the treatment gas along the circumferential direction of the gas ring to reduce the flow velocity of the treatment gas along the circumferential direction.

It is possible to supply the treatment gas more uniformly by sufficiently reducing also the flow velocity of the treatment gas along the circumferential direction.

In another aspect of the present invention, a heat treatment apparatus includes the following: a chamber having a side wall in a substantially cylindrical shape; a holder for holding a substrate in the chamber; a light irradiator for irradiating the substrate held by the holder with light; a buffer section for diffusing treatment gas supplied from the outside of the chamber, along a circumferential direction of the side wall; a resistive section for allowing the treatment gas filled in the buffer section to flow from the inside to the outside along a radial direction of the side wall and giving resistance to a flow of the treatment gas to reduce flow velocity of the treatment gas along the radial direction; and a discharge flow path for discharging the treatment gas flowing out of the resistive section into the chamber by allowing the treatment gas to flow from the outside toward the inside along the radial direction of the side wall.

Even if a flow rate of the treatment gas supplied into the chamber is increased, flow velocity thereof can be reduced by evenly diffusing the treatment gas, thereby enabling the treatment gas to be uniformly supplied.

Preferably, the resistive section is provided with a projection that gives resistance to the flow of the treatment gas along the circumferential direction of the side wall to reduce the flow velocity of the treatment gas along the circumferential direction.

It is possible to supply the treatment gas more uniformly by sufficiently reducing also the flow velocity of the treatment gas along the circumferential direction. Therefore, it is an object of the present invention to uniformly supply treatment gas into a chamber even if a flow rate of the treatment gas is increased.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a sectional view of the susceptor;

FIG. 5 is a plan view of a transfer mechanism;

FIG. 6 is a side view of the transfer mechanism;

FIG. 7 is a plan view showing a placement of a plurality of halogen lamps;

FIG. 12 is a sectional view showing a flow of treatment gas in an internal space of the gas ring;

DESCRIPTION OF THE PREFERRED EMBODIMENTS

A preferred embodiment according to the present invention will now be described in detail with reference to the drawings.

Figure 1:
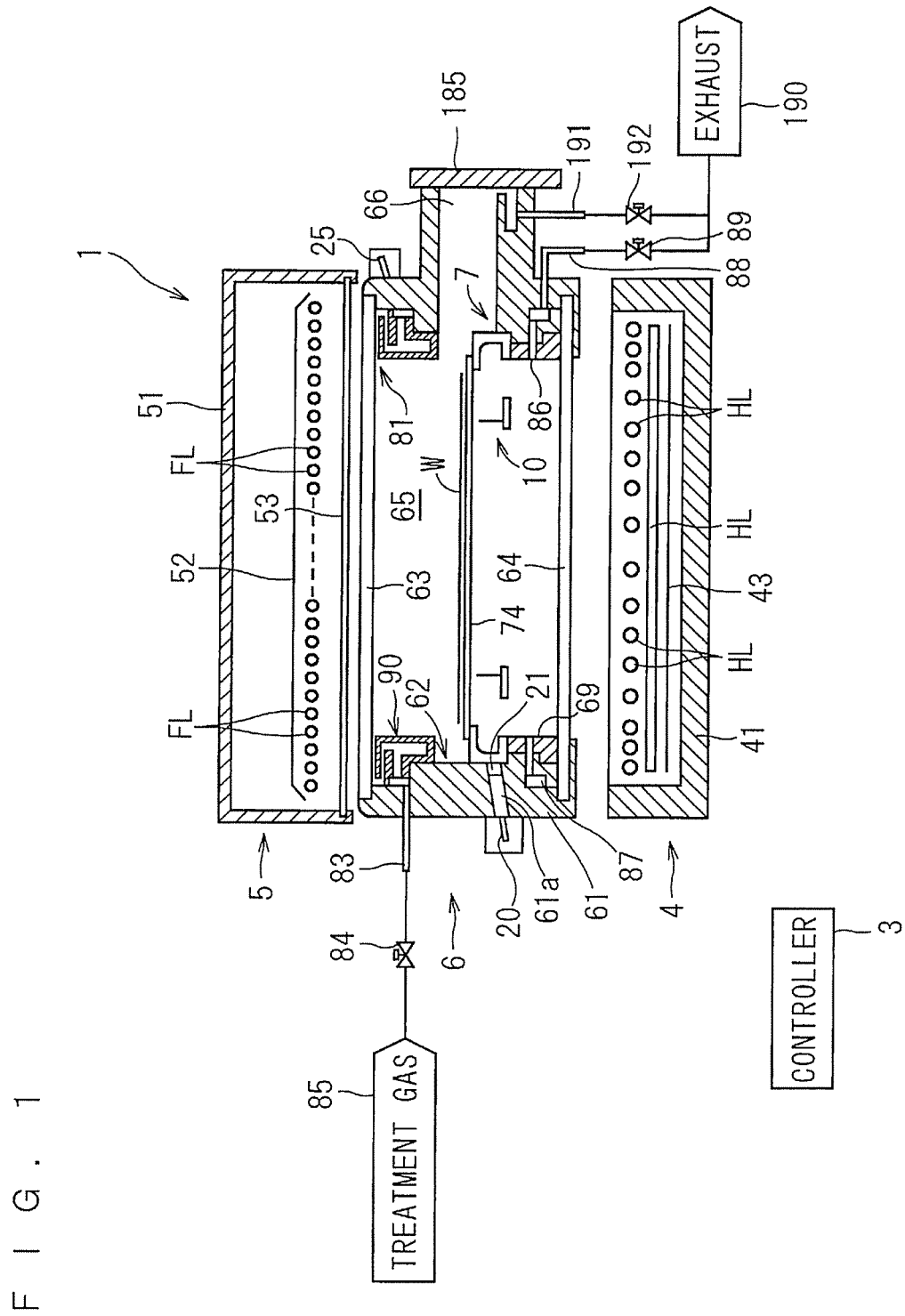
FIG. 1 is a longitudinal sectional view showing a structure of a heat treatment apparatus according to the present invention.

FIG. 1 is a longitudinal sectional view showing a structure of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm (in the present preferred embodiment, 300 mm). The semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a substantially cylindrical shape with an open top and an open bottom. The upper chamber window 63 is mounted to block the open top of the chamber side portion 61, and the lower chamber window 64 is mounted to block the open bottom thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

A gas ring 90 is mounted to an upper portion of the inner wall surface of the chamber side portion 61, and a reflective ring 69 is mounted to a lower portion thereof. The gas ring 90 and the reflective ring 69 are each formed in an annular shape. An interior space of the chamber 6, or a space surrounded by the upper chamber window 63, the lower chamber window 64, the chamber side portion 61, the reflective ring 69, and the gas ring 90, is defined as a heat treatment space 65.

A recessed portion 62 is defined in the inner wall surface of the chamber 6 by mounting the reflective ring 69 and the gas ring 90 to the chamber side portion 61. Specifically, there is defined the recessed portion 62 surrounded by a middle portion of the inner wall surface of the chamber side portion 61 where the reflective ring 69 and the gas ring 90 are not mounted, an upper end surface of the reflective ring 69, and a lower end surface of the gas ring 90. The recessed portion 62 is provided in the form of a horizontal annular ring in the inner wall surface of the chamber 6, and surrounds the holder 7 which holds a semiconductor wafer W.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a bored therein. A lower radiation thermometer 20 is mounted to a portion of an outer wall surface of the chamber side portion 61 where the through hole 61a is provided. The through hole 61a is a cylindrical hole for directing infrared radiation, emitted from the lower surface of a semiconductor wafer W held by a susceptor 74 described below, therethrough to the lower radiation thermometer 20. The through hole 61a is inclined with respect to a horizontal direction so that the longitudinal axis (axis extending in a direction in which the through hole 61a extends through the chamber side portion 61) of the through hole 61a intersects a main surface of the semiconductor wafer W held by the susceptor 74. A transparent window 21 made of barium fluoride material transparent to infrared radiation in a wavelength range measurable with the lower radiation thermometer 20 is mounted to an end portion of the through hole 61a, facing the heat treatment space 65.

At least one gas discharge opening 81 for supplying a treatment gas therethrough into the heat treatment space 65 is provided in an upper portion of the inner wall of the chamber 6. The gas discharge opening 81 is formed between the gas ring 90 and the upper chamber window 63. The gas discharge opening 81 is connected in communication with a gas supply pipe 83 through an internal space of the gas ring 90. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the gas ring 90, and the treatment gas having passed through the internal space of the gas ring 90 is discharged from the gas discharge opening 81 into the heat treatment space 65. Examples of the treatment gas usable herein include inert gases such as nitrogen gas ($N_2$), reactive gases such as hydrogen ($H_2$) and ammonia ($NH_3$), and mixtures of these gases (although nitrogen gas is used in the present preferred embodiment). A structure of the gas ring 90 will be described later.

At least one gas exhaust opening 86 for exhausting a gas from the heat treatment space 65 is provided in a lower portion of the inner wall of the chamber 6. The gas exhaust opening 86 is provided below the recessed portion 62, and may be provided in the reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The treatment gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
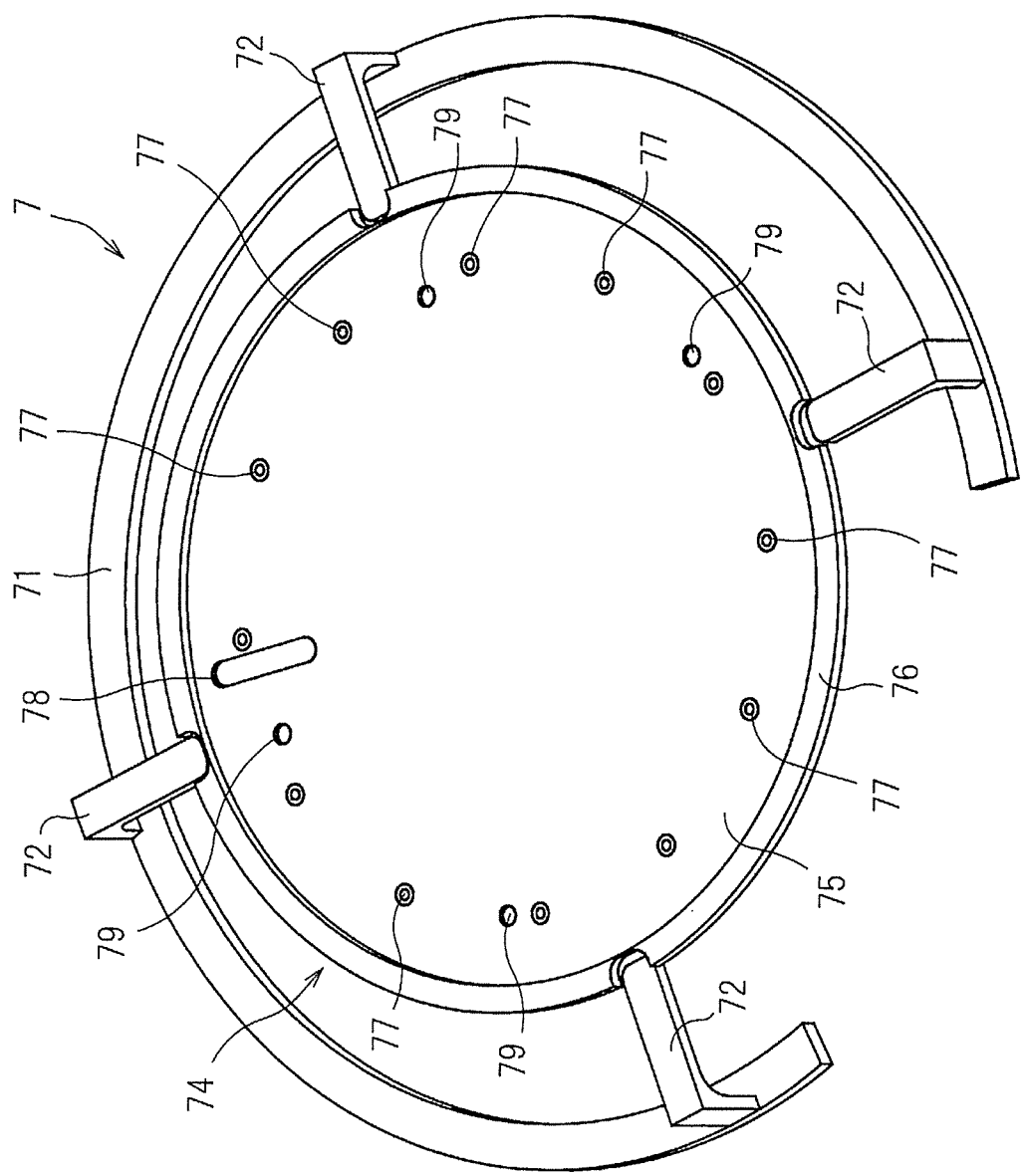
FIG. 2 is a perspective view showing an entire external appearance of a holder.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

Figure 3:
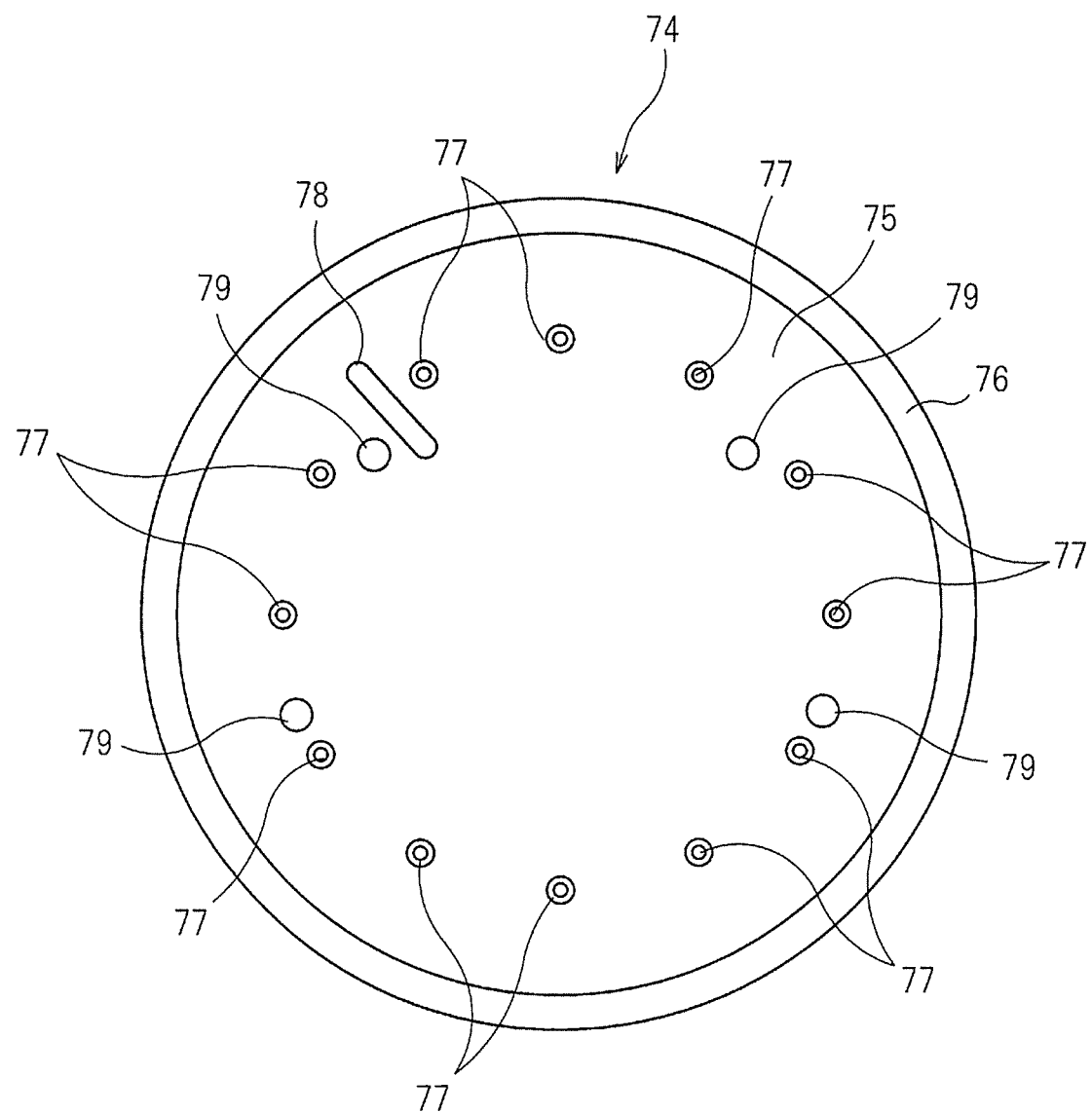
FIG. 3 is a plan view of a susceptor.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by a wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding. The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 provided upright are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is slightly smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the susceptor 74 coincides with a vertical direction). In other words, the holding surface 75a of the holding plate 75 becomes a horizontal plane.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is formed in the holding plate 75 of the susceptor 74 so as to extend vertically through the holding plate 75 of the susceptor 74. The opening 78 is provided for the lower radiation thermometer 20 to receive radiation (infrared radiation) emitted from the lower surface of the semiconductor wafer W. Specifically, the lower radiation thermometer 20 receives the radiation emitted from the lower surface of the semiconductor wafer W through the opening 78 and the transparent window 21 mounted to the through hole 61a in the chamber side portion 61 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane. The area where the plurality of flash lamps FL are arranged is larger than the plane size of the semiconductor wafer W.

Each of the xenon flash lamps FL includes a cylindrical glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission.

Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 is a light irradiator that directs light from under the chamber 6 through the lower chamber window 64 toward the heat treatment space 65 to heat the semiconductor wafer W by means of the halogen lamps HL.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a cylindrical glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

Figure 8:
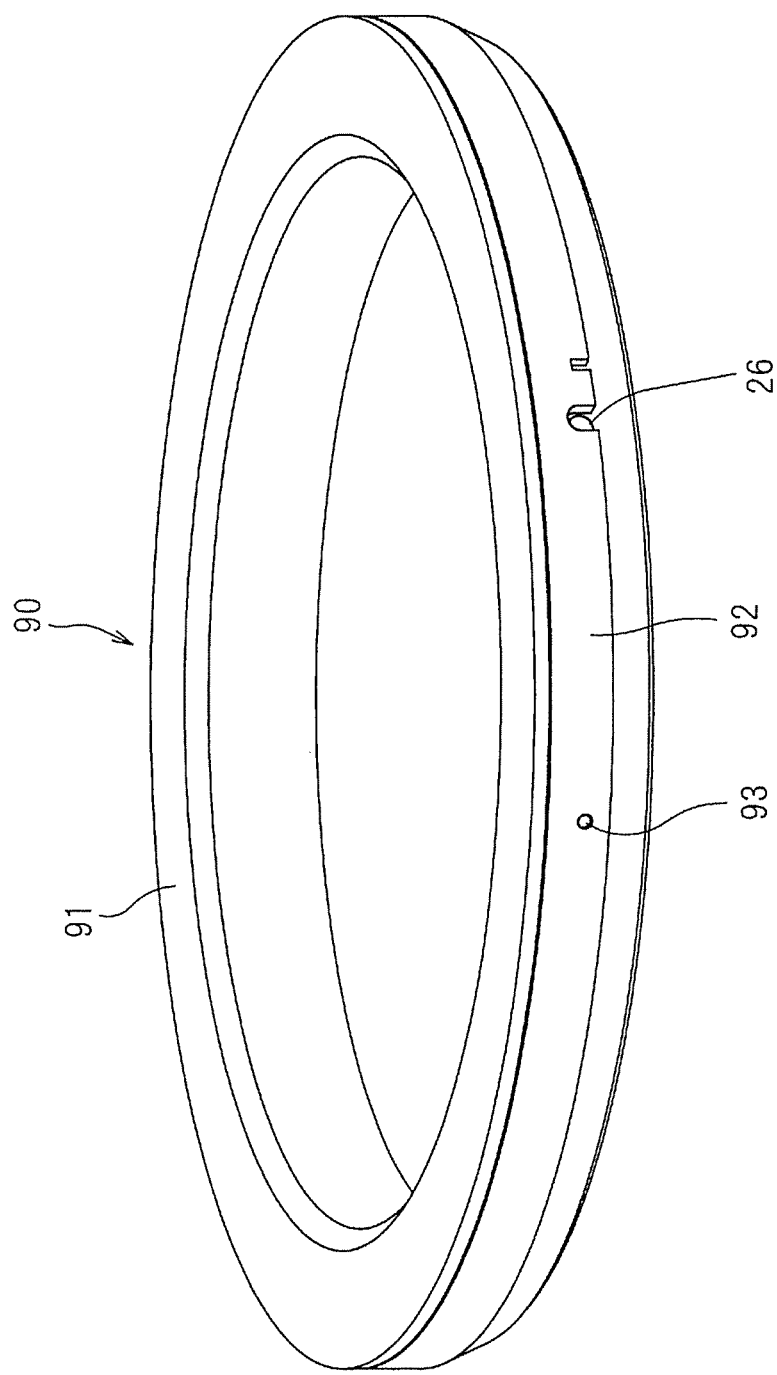
FIG. 8 is a perspective view showing an entire appearance of a gas ring.
Figure 9:
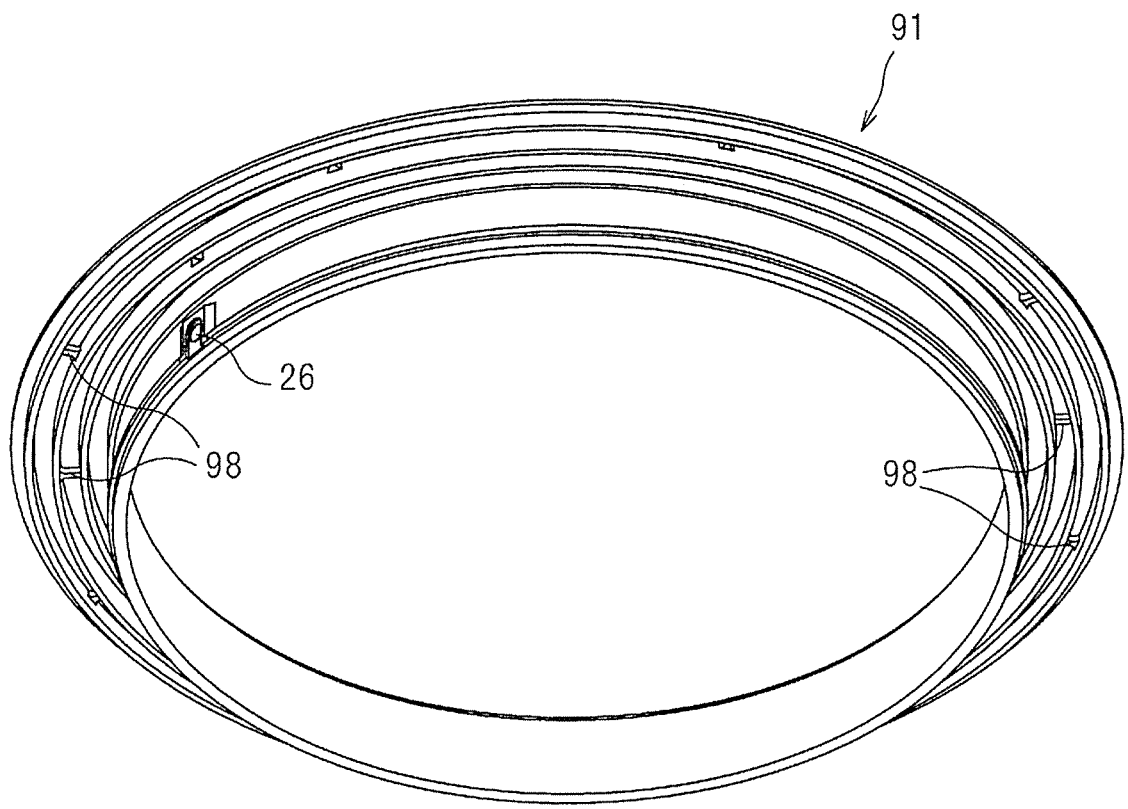
FIG. 9 is a perspective view showing an appearance of an upper ring.
Figure 10:
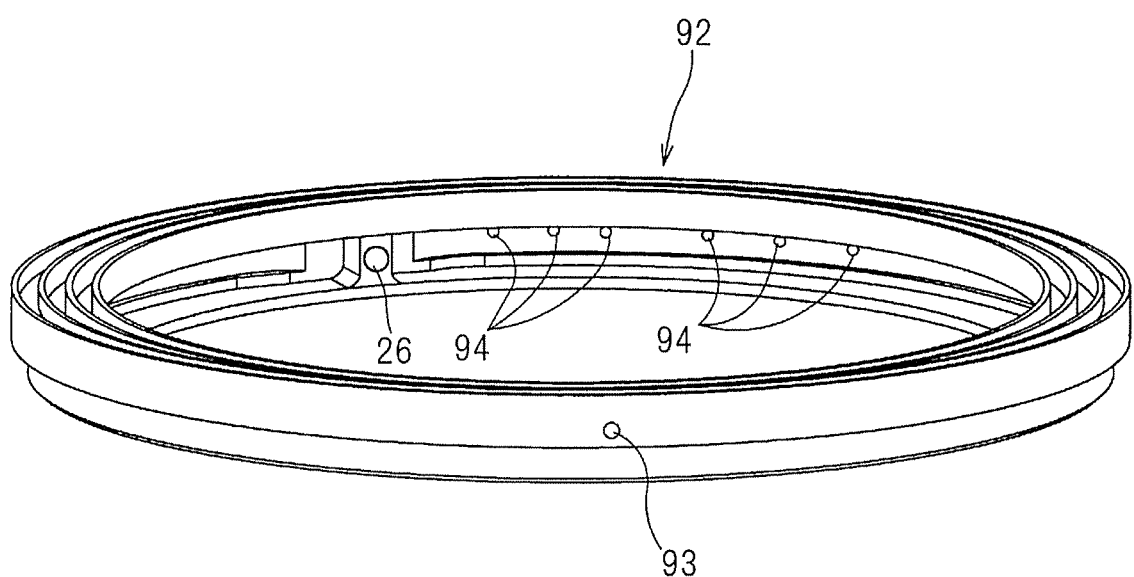
FIG. 10 is a perspective view showing an appearance of a lower ring.

Next, a structure of the gas ring 90 will be described. FIG. 8 is a perspective view showing an entire appearance of the gas ring 90. The gas ring 90 mounted on the upper portion of the inner wall surface of the substantially cylindrical chamber side portion 61 has an annular shape. The gas ring 90 is mounted such that its center coincides with the center of the chamber side portion 61. That is, the radial direction and the circumferential direction of the gas ring 90, and the radial direction and the circumferential direction of the chamber side portion 61 are coincident. The gas ring 90 includes an upper ring 91 and a lower ring 92. FIG. 9 is a perspective view showing an appearance of the upper ring 91. FIG. 10 is a perspective view showing an appearance of the lower ring 92. The upper ring 91 and the lower ring 92 are fitted to each other to form the gas ring 90.

As shown in FIGS. 8 and 10, a gas supply port 93 is formed in the outer wall surface of the lower ring 92. The gas supply port 93 is formed at each of opposite ends in the radial direction of the gas ring 90. That is, the gas supply port 93 is formed at two places in the outer wall surface of the lower ring 92, the two places facing each other at an interval of 180° intervals as viewed from the center of gas ring 90. The gas supply pipe 83 (FIG. 1) is connected to the gas supply port 93 at each of the two places.

The lower ring 92 is provided with a plurality of vent holes 94. The vent holes 94 each allow a first buffer 95 and a second buffer 96, described below, to communicate with each other. The gas supply port 93 at each of the two places and the vent holes 94 are provided at respective different positions in the circumferential direction of the gas ring 90. That is, the gas supply port 93 at each of the two places and the vent holes 94 are provided so as not to overlap as viewed form the center of the gas ring 90.

The upper ring 91 and the lower ring 92 are each provided with a through hole 26. The through hole 26 is a cylindrical hole for directing infrared radiation, emitted from the upper surface of a semiconductor wafer W held by the susceptor 74, therethrough to an upper radiation thermometer 25 (FIG. 1) attached to the outer wall surface of the chamber side portion 61. The through hole 26 is inclined with respect to a horizontal direction so that the longitudinal axis (axis extending in a direction in which the through hole 26 extend through the chamber side portion 61) of the through hole 26 intersects a main surface of the semiconductor wafer W held by the susceptor 74. A transparent window made of calcium fluoride material transparent to infrared radiation in a wavelength range measurable with the upper radiation thermometer 25 may be mounted to an end portion of the through hole 26 which faces the heat treatment space 65. As shown in FIG. 8, the through hole 26 is provided at a position biased to one of the two gas supply ports 93.

Figure 11:
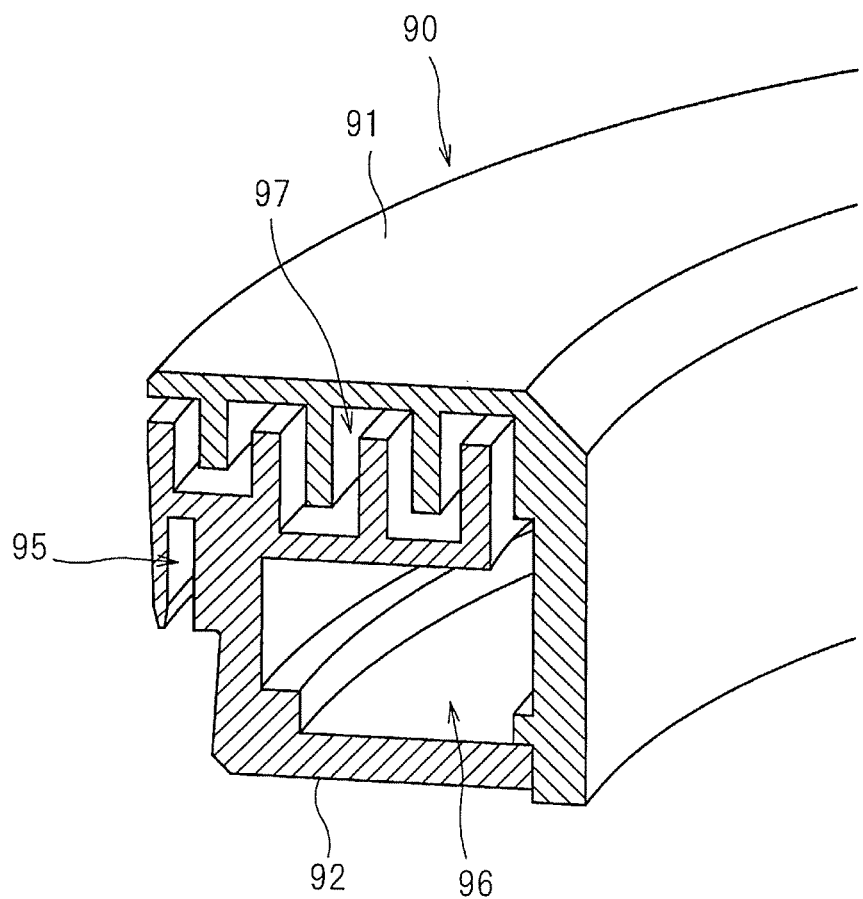
FIG. 11 is a perspective view showing a sectional structure of the gas ring.
Figure 1:
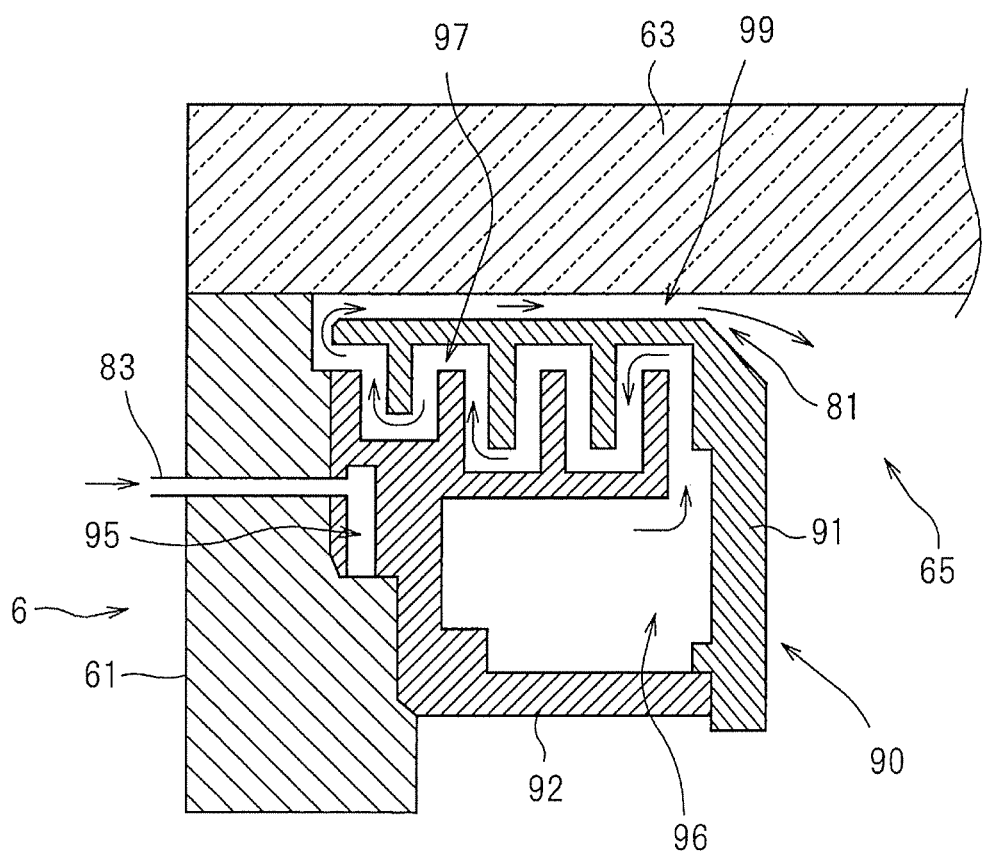

FIG. 11 is a perspective view showing a sectional structure of the gas ring 90. FIG. 12 is a sectional view showing a flow of treatment gas in an internal space of the gas ring 90. The first buffer 95 is formed inside the lower ring 92 of the gas ring 90. The first buffer 95 is a substantially annular shaped space. When the gas ring 90 is attached to the upper portion of the inner wall surface of the chamber side portion 61, the opening portion at the lower end of the first buffer 95 is closed by the chamber side portion 61, and the first buffer 95 becomes an enclosed space. The first buffer 95 is not completely annular shaped space, and is blocked by the portion provided with the through hole 26 for the upper radiation thermometer 25. The gas supply port 93 is formed so as to communicate with the first buffer 95, and the treatment gas fed from the gas supply pipe 83 first flows into the first buffer 95 through the gas supply port 93 at each of the two places.

When the upper ring 91 and the lower ring 92 are fitted to each other, the second buffer 96 is formed inside the gas ring 90. The second buffer 96 is also a substantially annular space. As with the first buffer 95, the second buffer 96 is not completely annular shaped space, and is blocked by the portion provided with the through hole 26 (refer to FIG. 10).

The first buffer 95 and the second buffer 96 communicate with each other through the plurality of vent holes 94. The volume of the second buffer 96 is larger than the volume of the first buffer 95. The treatment gas flowing into the first buffer 95 passes through the plurality of vent holes 94 to flow into the second buffer 96. At this time, the gas supply port 93 at each of the two places and the plurality of vent holes 94 are provided at respective different positions in the circumferential direction of the gas ring 90, so that the treatment gas supplied from the gas supply port 93 is prevented from directly passing through the vent holes 94 to flow into the second buffer 96.

In addition, when the upper ring 91 and the lower ring 92 are fitted to each other, a labyrinth portion 97 is formed on an upper side of the second buffer 96. More specifically, when a plurality of concentric cylindrical walls formed so as to protrude downward from the upper ring 91, and a plurality of concentric cylindrical walls formed so as to protrude upward from the lower ring 92 are alternately assembled at a predetermined interval, the labyrinth portion 97 is formed. The labyrinth portion 97 serves as a bent flow path along the radial direction of the gas ring 90.

As shown in FIG. 9, a plurality of projections 98 is provided on the inner wall surface of the upper ring 91 forming the labyrinth portion 97. The projections 98 give resistance to the flow of the treatment gas along the circumferential direction of the gas ring 90 in the labyrinth portion 97. The through hole 26 does not pass through the labyrinth portion 97, and the flow path of the labyrinth portion 97 communicates over the entire circumference of the gas ring 90 in the circumferential direction.

The treatment gas filled in the second buffer 96 flows into the labyrinth portion 97 and flows through the bent flow path of the labyrinth portion 97 from the inside toward the outside along the radial direction of the gas ring 90. At this time, the treatment gas flows through the bent flow path, so that the labyrinth portion 97 gives resistance to the flow of the treatment gas along the radial direction of the gas ring 90. The treatment gas flowing into the labyrinth portion 97 also flows in the flow path of the labyrinth portion 97 along the circumferential direction of the gas ring 90. At this time, the projections 98 provided in the labyrinth portion 97 give resistance to the flow of the treatment gas along the circumferential direction of the gas ring 90.

As shown in FIG. 12, a gap of a predetermined interval is formed between the upper surface of the upper ring 91 of the gas ring 90 and the upper chamber window 63 made of quartz, and this gap serves as a discharge flow path 99 of the treatment gas. A distal end of the discharge flow path 99 facing the heat treatment space 65 serves as the gas discharge opening 81. The treatment gas having passed through the bent flow path of the labyrinth portion 97 and flowed out from the labyrinth portion 97 flows into the discharge flow path 99, and flows in the discharge flow path 99 from the outside toward the inside along the radial direction of the gas ring 90 to be discharged from the gas discharge opening 81 into the heat treatment space 65.

Returning to FIG. 1, the controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment of a semiconductor wafer W in the heat treatment apparatus 1 will be described. A semiconductor wafer W to be treated herein is a semiconductor substrate doped with impurities (ions) by an ion implantation process. The impurities are activated by the heat treatment apparatus 1 performing the process of heating (annealing) the semiconductor wafer W by irradiation with a flash of light. The procedure for the treatment in the heat treatment apparatus 1 which will be described below proceeds under the control of the controller 3 over the operating mechanisms of the heat treatment apparatus 1.

First, the valve 84 is opened for supply of gas, and the valves 89 and 192 for exhaust of gas are opened, so that the supply and exhaust of gas into and out of the chamber 6 start. When the valve 84 is opened, nitrogen gas as the treatment gas is fed from the treatment gas supply source 85 to the gas ring 90, and the nitrogen gas having passed through the internal space of the gas ring 90 is discharged from the gas discharge opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with process steps.

Subsequently, the gate valve 185 is opened to open the transport opening 66. A transport robot outside the heat treatment apparatus 1 transports a semiconductor wafer W after ion implantation through the transport opening 66 into the heat treatment space 65 of the chamber 6. While at this time, an atmosphere outside the apparatus may be sucked when the semiconductor wafer W is transferred, nitrogen gas being continuously supplied into the chamber 6 flows out through the transport opening 66 to enable reduction in suction of an external atmosphere as much as possible.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof patterned and implanted with impurities is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held in a horizontal attitude from below by the susceptor 74 of the holder 7 made of quartz, the 40 halogen lamps HL in the halogen heating part 4 turn on simultaneously to start preheating (or assist-heating). Halogen light emitted from the halogen lamps HL is transmitted through the lower chamber window 64 and the susceptor 74 both made of quartz, and impinges upon the lower surface of the semiconductor wafer W. By receiving halogen light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the lower radiation thermometer 20 when the halogen lamps HL perform the preheating.

Specifically, the lower radiation thermometer 20 receives infrared radiation emitted from the lower surface of the semiconductor wafer W held by the susceptor 74 through the opening 78 and passing through the transparent window 21 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the lower radiation thermometer 20. The preheating temperature T1 shall be on the order of 200° C. to 800° C., preferably on the order of 350° C. to 600° C., (in the present preferred embodiment, 600° C.) at which there is no apprehension that the impurities implanted in the semiconductor wafer W are diffused by heat.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the lower radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

The flash lamps FL in the flash heating part 5 irradiate the front surface of the semiconductor wafer W held by the susceptor 74 with a flash of light at the time when a predetermined time period has elapsed since the temperature of the semiconductor wafer W reached the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The temperature of the front surface of the semiconductor wafer W subjected to the flash heating by the flash irradiation from the flash lamps FL momentarily increases to a treatment temperature T2 of 1000° C. or higher. After the impurities implanted in the semiconductor wafer W are activated, the temperature of the front surface of the semiconductor wafer W decreases rapidly. Because of the capability of increasing and decreasing the temperature of the front surface of the semiconductor wafer W in an extremely short time, the heat treatment apparatus 1 achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs. Further, the front surface temperature of the semiconductor wafer W at the time of flash light irradiation may be measured by the upper radiation thermometer 25.

After a predetermined time period has elapsed since the completion of the flash heating treatment, the halogen lamps HL turn off. This causes the temperature of the semiconductor wafer W to decrease rapidly from the preheating temperature T1. The lower radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the lower radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

Meanwhile, at the time of flash heating, the front surface of the semiconductor wafer W is instantaneously irradiated with a flash of light having extremely high energy, so that front surface temperature of the semiconductor wafer W rapidly rises in a moment. As a result, the front surface of the semiconductor wafer W suddenly thermally expands to cause sliding between the lower surface of the semiconductor wafer W and the susceptor 74, and turbulence of the gas flow, so that particles may be generated in the chamber 6. Such particles cause contamination of the semiconductor wafer W, so that it is effective to efficiently discharge the generated particles from the chamber 6 by increasing a flow rate of the nitrogen gas to be supplied into the chamber 6. The timing of increasing the flow rate of the nitrogen gas is not particularly limited, and can be set at an appropriate time (e.g., immediately before or immediately after the flash light irradiation).

In the present preferred embodiment, the flow rate of the nitrogen gas is increased to a large flow rate of 100 l/min, for example, to discharge the particles from the chamber 6. The nitrogen gas fed from the treatment gas supply source 85 at a large flow rate of 100 l/min flows into the first buffer 95 of the gas ring 90 at 50 l/min through the gas supply port 93 at each of the two places. The nitrogen gas flowing into the first buffer 95 immediately diffuses uniformly in the first buffer 95 along the circumferential direction of the gas ring 90, and is filled into the internal space of the first buffer 95. This reduces flow velocity of the nitrogen gas at a large flow rate. The first buffer 95 is blocked at the portion where the through hole 26 is provided, so that the nitrogen gas does not flow beyond the portion. In addition, the gas supply port 93 at each of the two places and the plurality of vent holes 94 are provided at respective different positions so as not to overlap in the circumferential direction of the gas ring 90, so that the nitrogen gas supplied from the gas supply port 93 is prevented from directly passing through the vent holes 94 to flow into the second buffer 96.

The nitrogen gas filled in the first buffer 95 passes through the plurality of vent holes 94 to flow into the second buffer 96. The nitrogen gas flowing into the second buffer 96 with a volume larger than that of the first buffer 95 more uniformly diffuses in the second buffer 96 along the circumferential direction of the gas ring 90, and is filled into the internal space of the second buffer 96. When the nitrogen gas flows from the first buffer 95 into the second buffer 96 with a volume larger than that of the first buffer 95, the flow velocity of the nitrogen gas is further reduced. The second buffer 96 is also blocked at the portion where the through hole 26 is provided, so that the nitrogen gas does not flow beyond the portion.

The nitrogen gas filled in the second buffer 96 flows into the labyrinth portion 97. The nitrogen gas flowing into the labyrinth portion 97 flows through the bent flow path of the labyrinth portion 97 from the inside toward the outside along the radial direction of the gas ring 90. The nitrogen gas flows through the bent flow path, so that the flow of the nitrogen gas along the radial direction of the gas ring 90 receives a resistance from the labyrinth portion 97. As a result, the flow velocity of the nitrogen gas along the radial direction of the gas ring 90 further decreases.

The nitrogen gas flowing into the labyrinth portion 97 also flows along the circumferential direction of the gas ring 90 in the flow path of the labyrinth portion 97. The flow of the nitrogen gas along the circumferential direction of the gas ring 90 in the labyrinth portion 97 receives resistance from the projections 98. As a result, the flow velocity of the nitrogen gas along the circumferential direction of the gas ring 90 also decreases.

The nitrogen gas having passed through the labyrinth portion 97 flows into the discharge flow path 99 formed between the gas ring 90 and the upper chamber window 63. The nitrogen gas flowing into the discharge flow path 99 flows in the discharge flow path 99 from the outside to the inside along the radial direction of the gas ring 90 to be discharged from the gas discharge opening 81 formed at the distal end of the discharge flow path 99 into the heat treatment space 65. The flow velocity of the nitrogen gas along the radial direction and the circumferential direction of the gas ring 90 is sufficiently low at the time when the nitrogen gas flowing out from the labyrinth portion 97 flows into the discharge flow path 99, so that the nitrogen gas flows gently in the discharge flow path 99. As a result, nitrogen gas is uniformly discharged throughout the entire circumference of the gas discharge opening 81.

As described above, in the present preferred embodiment, supplying nitrogen gas through the gas ring 90 having the buffer section and the labyrinth structure enables the nitrogen gas to be uniformly supplied throughout the entire circumference of the heat treatment space 65 even if a flow rate of the nitrogen gas supplied into the chamber 6 is increased. As a result, reduction in in-plane uniformity of temperature distribution of the semiconductor wafer W can be prevented.

While the preferred embodiment according to the present invention has been described hereinabove, various modifications of the present invention in addition to those described above may be made without departing from the scope and spirit of the invention. For example, instead of the labyrinth portion 97 of the above preferred embodiment, a structure as shown in FIG. 13 or 14 may be provided in the gas ring.

Figure 13:
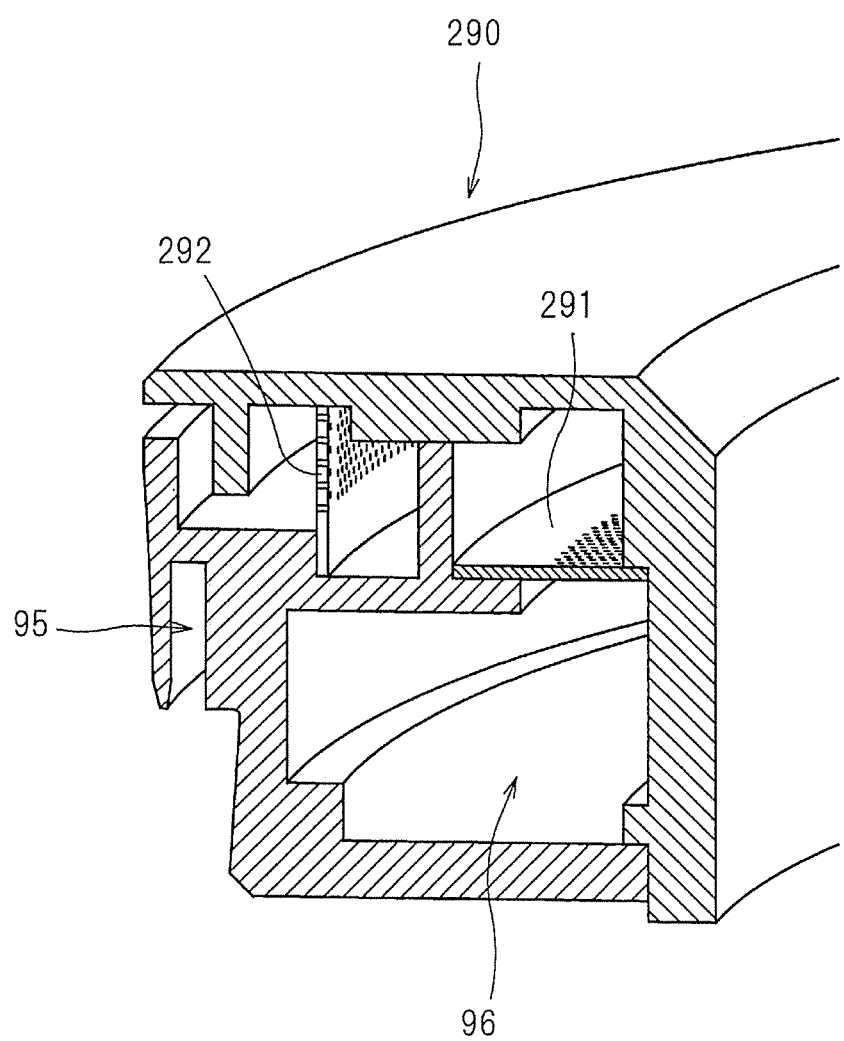
FIG. 13 is a perspective view showing a sectional structure of the gas ring provided with a mesh plate.

FIG. 13 is a perspective view showing a sectional structure of a gas ring 290 provided with mesh plates 291 and 292. The gas ring 290 shown in FIG. 13 also includes a first buffer 95 and a second buffer 96 similar to those in the above preferred embodiment. The gas ring 290 is provided with two mesh plates 291 and 292 instead of the labyrinth portion 97 of the above preferred embodiment. Each of the two mesh plates 291 and 292 is a plate-shaped member formed with a large number of through holes. In the gas ring 290 shown in FIG. 13, when the nitrogen gas filled in the second buffer 96 passes through the two mesh plates 291 and 292, the flow of the nitrogen gas along the radial direction of the gas ring 290 receives resistance from the two mesh plates 291 and 292. The gas ring 290 of FIG. 13 is also provided with a projection similar to the projection 98 in the above preferred embodiment, and a flow of nitrogen gas along the circumferential direction of the gas ring 290 receives resistance from the projection. As a result, as with the above preferred embodiment, when nitrogen gas flows into the discharge flow path 99 formed between the gas ring 290 and the upper chamber window 63, flow velocity of the nitrogen gas along the radial direction and the circumferential direction of the gas ring 290 sufficiently decreases to enable the nitrogen gas to be uniformly supplied throughout the entire circumference of the heat treatment space 65.

Figure 14:
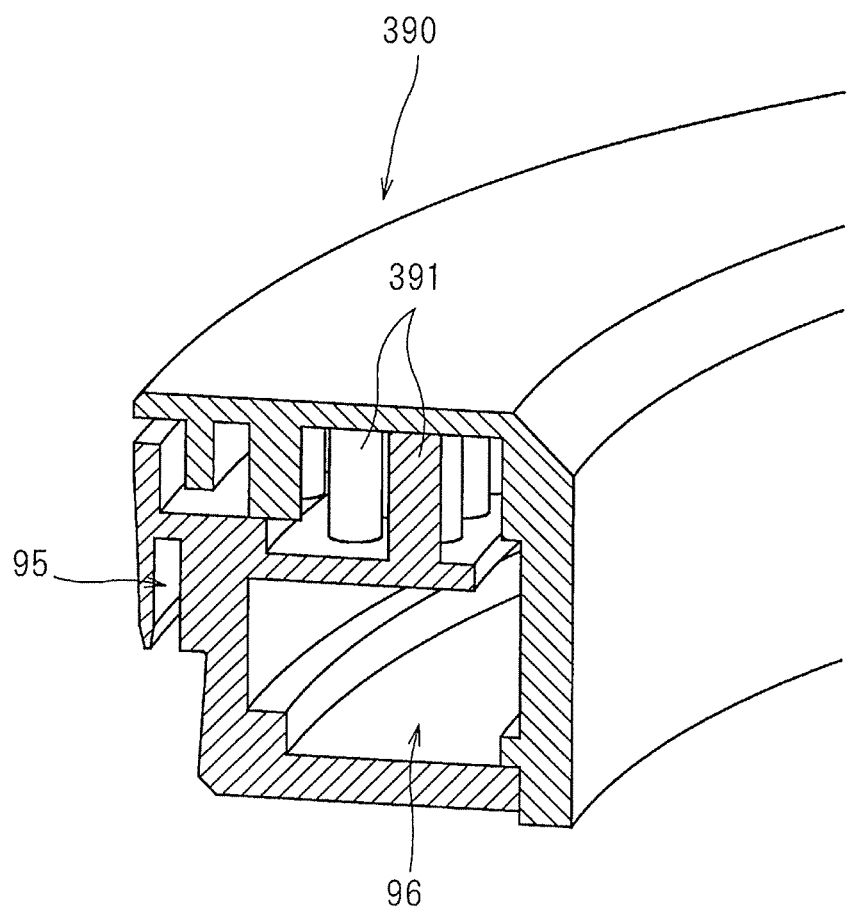
FIG. 14 is a perspective view showing a sectional structure of the gas ring provided with a plurality of columnar members.

Meanwhile, FIG. 14 is a perspective view showing a sectional structure of a gas ring 390 provided with a plurality of columnar members 391. The gas ring 390 shown in FIG. 14 also includes a first buffer 95 and a second buffer 96 similar to those in the above preferred embodiment. The gas ring 390 is provided with a plurality of columnar members 391 instead of the labyrinth portion 97. In the gas ring 390 shown in FIG. 14, when nitrogen gas filled in the second buffer 96 passes through gaps between the corresponding columnar members 391, a flow of the nitrogen gas along the radial direction of the gas ring 390 receives resistance from the columnar members 391. In addition, in the gas ring 390 shown in FIG. 14, a flow of the nitrogen gas along the circumferential direction of the gas ring 390 also receives resistance from the columnar members 391. As a result, as with the above preferred embodiment, when nitrogen gas flows into the discharge flow path 99 formed between the gas ring 390 and the upper chamber window 63, flow velocity of the nitrogen gas along the radial direction and the circumferential direction of the gas ring 390 sufficiently decreases to enable the nitrogen gas to be uniformly supplied throughout the entire circumference of the heat treatment space 65.

In summary, it is preferable to provide a resistive section (the labyrinth portion 97, the mesh plates 291 and 292, or the columnar members 391) in a gas ring, the resistive section being configured to allow nitrogen gas filled in the second buffer 96 to flow from the inside to the outside along the radial direction of the gas ring and to give resistance to a flow of the nitrogen gas to reduce flow velocity of the nitrogen gas along the radial direction of the gas ring. Providing such a resistive section causes the nitrogen gas flowing out from the resistive section and having a reduced flow velocity to flow gently through the discharge flow path 99 from the outside toward the inside along the radial direction of the gas ring to enable the nitrogen gas to be uniformly discharged throughout the entire circumference of the gas discharge opening 81.

While the above preferred embodiment includes two-tier buffers of the first buffer 95 and the second buffer 96, the buffers may be one-tier buffers. In addition, a structure similar to the internal structure of the gas ring of the above preferred embodiment may be formed directly in the cylindrical chamber side portion 61. That is, it is preferable to provide a form including a buffer section for diffusing treatment gas, supplied from the outside of a chamber, along the circumferential direction of the cylindrical chamber side portion 61, and a resistive section for allowing the treatment gas filled in the buffer section to flow from the inside toward the outside along the radial direction of the chamber side portion 61 and to give resistance to a flow of the nitrogen gas to reduce flow velocity of the nitrogen gas along the radial direction.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the above preferred embodiment, although the filament-type halogen lamps HL each are used as a continuous lighting lamp that emits light continuously for not less than one second to preheat a semiconductor wafer W, the present invention is not limited to this, and an arc lamp of a discharge type (e.g., xenon arc lamp) may be used as a continuous lighting lamp in place of the halogen lamp HL to perform preheating.

A substrate to be treated by the heat treatment apparatus according to the present invention is not limited to a semiconductor wafer, and may be a glass substrate to be used for a flat panel display such as a liquid crystal display device, and a substrate for a solar cell. Also, the heat treatment apparatus according to the present invention may perform heat treatment of high dielectric constant gate insulator films (high-k films), joining of metal and silicon, and crystallization of polysilicon.

In addition, the technique according to the present invention is not limited to a flash lamp annealer, and is suitably applicable to an apparatus for supplying a predetermined treatment gas into a chamber, such as a single wafer type lamp annealer and a CVD apparatus, using a halogen lamp.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus for irradiating a substrate with light to heat the substrate, the heat treatment apparatus comprising:

a chamber having a side wall in a substantially cylindrical shape;

a holder for holding a substrate in said chamber;

a light irradiator for irradiating said substrate held by said holder with light;

a quartz window provided so as to close an opening on one side of said side wall and to allow light emitted from said light irradiator to pass through into said chamber; and a gas ring in an annular shape attached to said side wall to guide treatment gas supplied from the outside of said chamber into said chamber, wherein said gas ring includes:

a buffer section for diffusing said treatment gas supplied from the outside of said chamber, along a circumferential direction of said gas ring; and a resistive section for allowing said treatment gas filled in said buffer section to flow from the inside to the outside along a radial direction of said gas ring and giving resistance to a flow of said treatment gas to reduce flow velocity of said treatment gas along the radial direction, wherein a discharge flow path is formed between said gas ring and said quartz window to discharge said treatment gas flowing out of said resistive section into said chamber by allowing said treatment gas to flow from the outside toward the inside along the radial direction of said gas ring, and wherein said resistive section includes a mesh plate provided with a plurality of holes.

2. A heat treatment apparatus for irradiating a substrate with light to heat the substrate, the heat treatment apparatus comprising:

a chamber having a side wall in a substantially cylindrical shape;

a holder for holding a substrate in said chamber;

a light irradiator for irradiating said substrate held by said holder with light;

a quartz window provided so as to close an opening on one side of said side wall and to allow light emitted from said light irradiator to pass through into said chamber; and a gas ring in an annular shape attached to said side wall to guide treatment gas supplied from the outside of said chamber into said chamber, wherein said gas ring includes:

a buffer section for diffusing said treatment gas supplied from the outside of said chamber, along a circumferential direction of said gas ring; and a resistive section for allowing said treatment gas filled in said buffer section to flow from the inside to the outside along a radial direction of said gas ring and giving resistance to a flow of said treatment gas to reduce flow velocity of said treatment gas along the radial direction, wherein a discharge flow path is formed between said gas ring and said quartz window to discharge said treatment gas flowing out of said resistive section into said chamber by allowing said treatment gas to flow from the outside toward the inside along the radial direction of said gas ring, and wherein said resistive section includes a plurality of columnar members.

* * * * *